United States Patent
Hsieh et al.

(10) Patent No.: US 9,892,889 B2
(45) Date of Patent: Feb. 13, 2018

(54) ROLL-TO-ROLL HYBRID PLASMA MODULAR COATING SYSTEM

(71) Applicant: Institute of Nuclear Energy Research, Atomic Energy Council, Executive Yuan, R.O.C., Taoyuan (TW)

(72) Inventors: Cheng-Chang Hsieh, Chiayi (TW); Deng-Lain Lin, Taoyuan (TW); Ching-Pei Tseng, Taoyuan (TW); Wen-Fa Tsai, Taoyuan (TW); Jiun-Shen Chen, Taoyuan (TW); Chi-Fong Ai, Taoyuan County (TW)

(73) Assignee: INSTITUTE OF NUCLEAR ENERGY RESEARCH, ATOMIC ENERGY COUNCIL, EXECUTIVE YUAN, R.O.C, Taoyuan (TW)

( * ) Notice: Subject to any disclaimer, the term of this patent is extended or adjusted under 35 U.S.C. 154(b) by 0 days.

(21) Appl. No.: 15/097,420

(22) Filed: Apr. 13, 2016

(65) Prior Publication Data
US 2017/0040150 A1    Feb. 9, 2017

(30) Foreign Application Priority Data
Aug. 6, 2015   (TW) .............................. 104125687 A (51) Int. Cl.
*C23C 14/34*   (2006.01)
*H01J 37/32*   (2006.01)
(Continued)

(52) U.S. Cl.
CPC ........ *H01J 37/32899* (2013.01); *C23C 14/35* (2013.01); *C23C 14/50* (2013.01);
(Continued)

(58) Field of Classification Search
CPC .... H01J 37/3277; C23C 14/56; C23C 14/568; C23C 14/562
See application file for complete search history.

(56) References Cited

U.S. PATENT DOCUMENTS

4,220,117 A * 9/1980 Shinohara ............. C23C 14/562 118/50
4,331,526 A * 5/1982 Kuehnle ............... C23C 14/562 204/192.13
(Continued)

*Primary Examiner* — Jason Berman
(74) *Attorney, Agent, or Firm* — Locke Lord LLP; Tim Tingkang Xia, Esq.

(57) ABSTRACT

The present invention relates to a roll-to-roll hybrid plasma modular coating system, which comprises: at least one arc plasma processing unit, at least one magnetron sputtering plasma processing unit, a metallic film and at least one substrate feeding unit. Each of the arc plasma processing unit is formed with a first chamber and an arc plasma source. Each of the magnetron sputtering plasma processing unit is formed with a second chamber and at least one magnetron sputtering plasma source. The metallic film is disposed in the arc plasma processing unit to avoid chamber wall being deposited by the arc plasma source; There are at least one arc plasma processing unit, at least one magnetron sputtering plasma processing unit and at least one winding/unwinding unit connected in series to lay at least one thin layer by arc plasma deposition or by magnetron sputtering plasma onto substrate material.

12 Claims, 4 Drawing Sheets

(51) Int. Cl.
*H01J 37/34* (2006.01)
*C23C 14/35* (2006.01)
*C23C 14/50* (2006.01)
*C23C 14/56* (2006.01)

(52) U.S. Cl.
CPC ............ C23C 14/56 (2013.01); C23C 14/562 (2013.01); C23C 14/568 (2013.01); H01J 37/32055 (2013.01); H01J 37/3277 (2013.01); H01J 37/32477 (2013.01); H01J 37/32743 (2013.01); H01J 37/3405 (2013.01); *H01J 2237/327* (2013.01); *H01J 2237/3322* (2013.01)

(56) References Cited

U.S. PATENT DOCUMENTS

| | | | | |
|---|---|---|---|---|
| 4,693,803 A | * | 9/1987 | Casey | C23C 14/562 204/298.24 |
| 5,472,509 A | * | 12/1995 | Hiroshi | C23C 16/4404 118/718 |
| 2009/0114534 A1 | * | 5/2009 | Green | C23C 14/0623 204/298.09 |

\* cited by examiner

ROLL-TO-ROLL HYBRID PLASMA MODULAR COATING SYSTEM

CROSS REFERENCE TO RELATED APPLICATION

This application also claims priority to Taiwan Patent Application No. 104125687 filed in the Taiwan Patent Office on Aug. 6, 2015, the entire content of which is incorporated herein by reference.

FIELD OF THE INVENTION

The present invention relates to a roll-to-roll hybrid plasma modular coating system, and more particularly, to a system with hybrid PVD processes by combining arc discharge and magnetron sputtering plasma technologies.

BACKGROUND OF THE INVENTION

Generally, a roll-to-roll plasma coating system produces devices by coating layers of thin film onto a web of substrate materials as the substrate material is continuously transported through different vacuum plasma coating chambers. Comparing with those conventional batch-type and inline-type plasma coating systems, roll-to-roll plasma coating systems can provide the most suitable thin film coating for high volume and cost-effective production. The use of a web of substrate materials for depositing has many advantages over other types of plane substrates. They are lightweight, flexible, durable, unbreakable and easily shipped products. And it helps tremendously in economizing on material and reducing the cost of process. Now the roll-to-roll coating systems have been already used in a wide range of industrial applications, including: food packaging, capacitor, flexible circuit board, PV solar cell, 3C product, solar control film, and so on.

Global warming induced by the emissions of greenhouse gases is one of the most critical environmental issues facing the world in recent years. Climate change will seriously affect life, environment and natural ecosystems on planet earth. Consequently, there are many technologies proposed to mitigate the damage of global warming, such as renewable energy, energy saving, energy efficiency improvement. And it is optimistic that global warming impacts can be mitigated.

In buildings sector, energy consumption is dominated by lighting, air conditioning and heating. It is responsible for approximately 30% of global energy demand. Thereby, reducing energy demand in the buildings sector plays a key role in reducing energy consumption. In order to reduce energy demand in building by regulating its temperature and illumination, building glazing can be coated with spectrally selective coatings which are able to transmit visible radiation and reflect infrared radiation. There are several commercial products currently available, such as Low-E glass, heat mirror and solar control film. However high-level products are too expensive for most peoples to install. From an economic point of view, it will inevitably demand a new low-cost thin film coating technology for solar control applications.

Multi-layer solar control films generally consisting of dielectric/metal/dielectric have been shown to have good properties, and can be produced on a large scale using vacuum magnetron sputtering technology. Reactive sputtering is widely used to prepare dielectric (metal oxide) layers thin films. In process, high flows of the reactive gases such as oxygen and argon are required for formation of metal oxide films during reactive sputtering of metal. However, metal oxide compounds are formed on the target surface and chamber wall at high flows of the reactive gases. These effects known as target poisoning and disappearing anode, lead to a decrease in the deposition rate and affected the composition of the film. The use of plasma process control of reactive gases and dual magnetron ac sputtering have made it possible to sputter dielectric (metal oxide) thin films at high deposition rates. However, the cost of associated equipment increases significantly.

In roll-to-roll production, moreover, it could take several tens of hours for coating lengths of several 1000 m web substrate. During sputtering, progressing erosion of the target material results in increasing strength of magnetic field at the target surface. Consequently, the depositing rate and composition of the deposited thin films are influenced. And a high-cost monitoring system is required to improve the stability of process.

SUMMARY OF THE INVENTION

In an embodiment, the present invention provides a roll-to-roll hybrid plasma modular coating system, comprising: at least one arc plasma processing unit, each formed with a first chamber and an arc plasma source for producing arc plasma that is housed inside the first chamber; at least one magnetron sputtering plasma processing unit, each formed with a second chamber and a magnetron sputtering plasma source for producing magnetron sputtering plasma that is housed inside the second chamber; a metallic film, disposed in the arc plasma processing unit to avoid deposition of target material on a wall in the deposition chamber by arc plasma source; and at least one substrate feeding unit, for feeding a substrate, formed with a third chamber; whereas the at least one arc plasma processing unit, the at least one magnetron sputtering plasma processing unit and at least one feeding unit are connected in series to be used for depositing at least one thin layer by arc plasma deposition or at least one thin layer by magnetron sputtering plasma onto a web substrate during the feeding of the web substrate.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention and wherein.

DESCRIPTION OF THE EXEMPLARY EMBODIMENTS

For your esteemed members of reviewing committee to further understand and recognize the fulfilled functions and structural characteristics of the invention, several exemplary embodiments cooperating with detailed description are presented as the follows.

Figure 1:
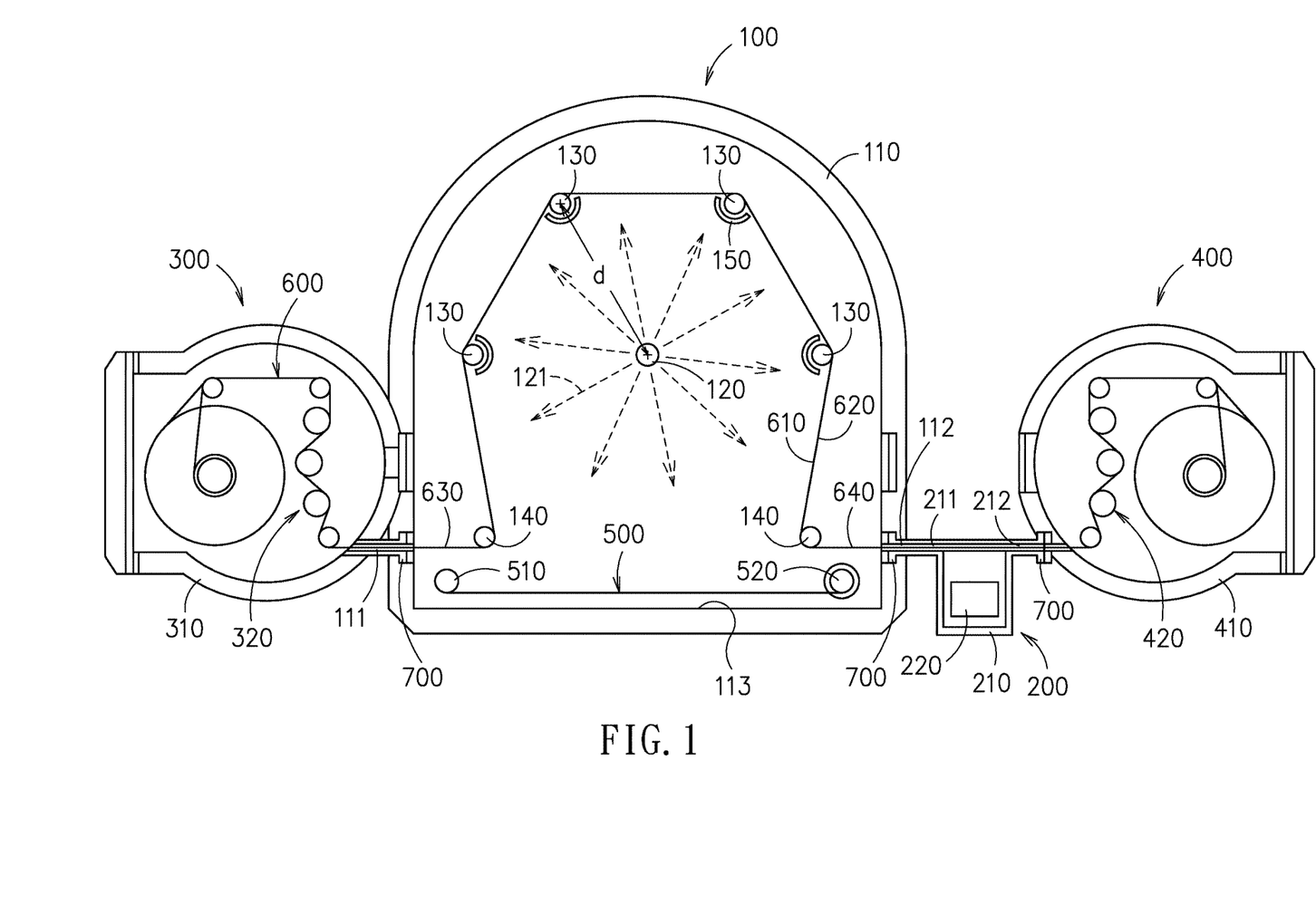
FIG. 1 is a schematic view of a roll-to-roll hybrid plasma modular coating system according to an embodiment of the present invention.

Please refer to FIG. 1, which is a schematic view of a roll-to-roll hybrid plasma modular coating system according to an embodiment of the present invention. In FIG. 1, a roll-to-roll hybrid plasma modular coating system comprises: an arc plasma processing unit 100, a magnetron sputtering plasma processing unit 200, a first substrate winding/unwinding unit 300, a second substrate winding/unwinding unit 400 and a metallic foil 500.

The arc plasma processing unit 100 is composed of: a cylinder-shaped vacuumed first chamber 110 and an arc plasma source 120, in which the first chamber 110 is formed with a first opening 111 and a second opening 112; and the arc plasma source 120 is disposed inside the first chamber 110 and is used for producing arc plasma 121 in a manner that the arc plasma 121 is emitted radially and centered to the arc plasma source. It is noted that the first chamber 110 is disposed coaxially with the arc plasma source 120 while allowing each of the first chamber 110 and the arc plasma source 120 to extend axially by a length. FIG. 1 shows a radial cross section of the arc plasma processing unit 100.

In the embodiment shown in FIG. 1, there is a first roller set received inside the first chamber 110. In FIG. 1, the first roller set includes a plurality of first primary rollers 130 and a plurality of first secondary rollers 140, which are used to get the web substrate from one processing unit to another. The plural first primary rollers 130 are disposed inside the first chamber 110 around the periphery of the arc plasma source 120 while allowing the plural first primary rollers 130 to be spaced from the arc plasma source 120 by an equal distance d. It is noted that the distance d is determined by actual requirement without any limitation, e.g. distance d can be ranged between 30-200 cm. In this embodiment, there is one first secondary roller 140 selected from the plural first secondary rollers 140 is arranged inside the first chamber 110 at a position neighboring to the first opening 111, whereas there is another first secondary roller 140 is arranged inside the first chamber 110 at a position neighboring to the second opening 112. It is noted that the amount of the first primary rollers 130 and the first secondary rollers 140 and also the arrangement of those are not restricted by the embodiment shown in FIG. 1. For instance, there can be more than four first primary rollers 130, there can be more than one first secondary rollers 140 being arranged neighboring to the first opening 111 and the second opening, and the plural first primary rollers 130 can be spaced from the arc plasma source 120 by different distances d.

In this embodiment, there is one shield 150 for each first primary roller 130, and each shield 150 is arranged at a position between its corresponding first primary roller 130 and the arc plasma source 120 so as to prevent the deposition on the first primary roller 130 by the arc plasma source 120. The shield 150 can be made from any material, such as stainless steel.

The first substrate winding/unwinding unit 300 is disposed outside the first chamber 110 at a position close to the first opening 111, whereas the first substrate winding/unwinding unit 300 is composed of a third chamber 310 and a third roller set 320. A web substrate 600 is drawn from wind/unwind roll which is mounted within a third chamber 310. It is noted that the third chamber 310 is connected to the first opening 111.

The magnetron sputtering plasma processing unit 200 is disposed outside the first chamber 110 at a position close to the second opening 112, whereas the magnetron sputtering plasma processing unit 200 is composed of a second chamber 210 and a magnetron sputtering plasma source 220. It is noted that the magnetron sputtering plasma source 220 is used for producing magnetron sputtering plasma. In addition, the end wall 700 is mounted with the other processing unit and winding/unwinding unit. Second chamber 210 is formed with a third opening 211 and a fourth opening 212, and the third opening 211 is arranged in flow communication with the second opening 112 of the first chamber 110.

The second substrate winding/unwinding unit 400 is disposed adjacent to the second chamber 210, whereas the second substrate winding/unwinding unit 400 is composed of a fourth chamber 410 and a fourth roller set 420. A web substrate 600 is drawn from wind/unwind roll which is mounted within a third chamber 410 t.

Thereby, the first substrate winding/unwinding unit 300, the arc plasma processing unit 100, the magnetron sputtering plasma processing unit 200 and the second substrate winding/unwinding unit 400 are connected in series. Moreover, there can be insulation structures 700 disposed at positions between the first chamber 110, the second chamber 210, the third chamber 310 and the fourth chamber 410, and each of the insulation structures 700 are provided for restricting diffusion of process gas from one processing chamber into another processing chamber to ensure the quality deposition film and increase the stability of the manufacturing process. There can be various types of insulation structures, that it can be formed as a slot or even a gas insulation chamber.

The first and the second substrate winding/unwinding units 300, 400 are provided for unwinding and winding the roll of substrate 600. It is noted that the substrate winding direction is reversible. In this embodiment, the arc plasma source 120 is designed with a length that is slightly larger than the width of the substrate 600. Thereby, the substrate 600 enters the first chamber 110 via the first opening 111, and then exits the first chamber 112 via the second opening 112. It is noted that the substrate 600 is a flexible substrate that is formed with a width, and can be made of any material that is selectable depending upon actual requirements.

The substrate 600 is formed with a first surface 610 and a second surface 620 that are arranged opposite to each other in a manner that the first surface 610 is disposed facing toward the plural first primary rollers 130 and abutting against the periphery of the plural first primary rollers 130, thereby, enabling the flexible substrate 600 to be stretched into a polygon. Moreover, the substrate 600 is formed with two opposite ends 630, 640, whereas the second surfaces 620 corresponding to the two ends 630, 640 of the substrate 600 is arranged abutting respectively against the first second rollers 140 that are disposed neighboring to the first opening 111 and the second opening 112 so as to enable the two ends 630, 640 of the substrate 600 to extend out of the first chamber 110 respectively via the first opening 111 and the second opening 112.

The metallic film 500 is disposed in the arc plasma processing unit 100 to avoid chamber wall 131 of the first chamber 110 being deposited by the arc plasma source 120. In this embodiment, the moving substrate 600 will not cover and block the interior bottom 113 of the first chamber from the radially emitted arc plasma 121, so that there will be deposited on the wall 131 if the wall 131 is not covered by such metallic film 500. Therefore, it is important to arrange the metallic films 500 at positions that are not covered by the moving substrate 600, and then after the metallic films 500 are contaminated by arc plasma in a manufacturing process, they can be replaced easily without having to clean up the whole system. In the embodiment shown in FIG. 1, the metallic film 500 can be a rollable film that are mounted on a roller set of two rollers 510, 520, using that the portion of the rollable film 500 which has been deposited by arc plasma thereon in a manufacturing process can be rolled up for exposing the portion of the rollable film 500 not yet being deposited by the arc plasma. The metallic film 500 can be made of any material as required, e.g. aluminum and stainless steel.

In the embodiment shown in FIG. 1, when the substrate 600 is being brought to move by the first substrate winding/unwinding unit 300 and the second substrate winding/unwinding unit 400, the first primary rollers 130 will be driven to move with the moving substrate 600 while the material evaporated by the arc plasma 121 emitted from the arc plasma source 120 is deposited on the first surface 610 of the substrate 600. It is noted that the shield 150 is arranged for preventing the first primary rollers 130 from being coated by the material evaporated by the arc plasma 121, by that not only the cleanness of the first primary rollers 130 can be ensured for preventing the substrate 600 from being scratched and damaged by the rolling first primary rollers 130, but also the temperature of the first primary rollers 130 will not be raised by the arc plasma 121 so as to prevent the substrate 600 from being damaged.

During the traveling of the substrate 600 between the first substrate winding/unwinding unit 300 and the second substrate winding/unwinding unit 400, the substrate 600 will be moved through the arc plasma processing unit 100, the magnetron sputtering plasma processing unit 200 so as to formed at least one arc plasma deposition layer or at least one magnetron sputtering plasma layer on a surface of the substrate 600. Consequently, when the substrate 600 is being fed passing through the arc plasma processing unit 100 and the magnetron sputtering plasma processing unit 200 repetitively by the use of the first substrate winding/unwinding unit 300 and the second substrate winding/unwinding unit 400, there can be more than two layers of film being formed on the substrate 600. Operationally, the arc plasma processing unit 100 and the magnetron sputtering plasma processing unit 200 can be enabled to operate at the same time, or only one of the devices selected from the arc plasma processing unit 100 and the magnetron sputtering plasma processing unit 200 is enabled to operate. In an embodiment, the substrate 600 that is unwound from the first substrate winding/unwinding unit 300 is guided to travel passing the arc plasma processing unit 100 firstly and the magnetron sputtering plasma processing unit 200 when both arc plasma processing unit 100 and the magnetron sputtering plasma processing unit 200 are activated, by that the substrate 600 will first be coated with an arc plasma deposition layer, and then on top of the arc plasma deposition layer, a magnetron sputtering plasma layer is coated. Thereafter, the substrate 600 is being wound into the second substrate winding/unwinding unit 400 while the magnetron sputtering processing unit 200 is being turned off, and then by the reversing of the second substrate winding/unwinding unit 400 and the first substrate winding/unwinding unit 300, the substrate 600 that had already being coated with an arc plasma deposition layer and a magnetron sputtering plasma layer is again being released and guide to travel passing the magnetron sputtering plasma processing unit 200 first and then the arc plasma processing unit 100, but only be coated with an arc plasma deposition layer since the magnetron sputtering plasma processing unit 200 is deactivated. Thereby, a substrate 600 with a three-layer film of arc plasma deposition layer/magnetron sputtering plasma layer/arc plasma deposition layer can be formed.

According to the forgoing description, the substrate 600 of the present invention is a rollable substrate that is formed with a specific width. In an embodiment of the present invention, the effective coating area of the substrate 600 is about $1.3 \sim 1.6 \times \pi \times d \times W$, wherein d is a distance measured between the first primary roller 130 and the arc plasma source 120 that is substantially the distance between the arc plasma source 120 and the substrate 600, and W is the width of the substrate 600. In addition, the rotation speed of the first primary roller 130 and the first secondary roller 140 are designed to be defined according to the tension control of the substrate 600, and thus can be determined according to the material of the substrate 600 and the actual requirement of the film deposition process.

Figure 2:
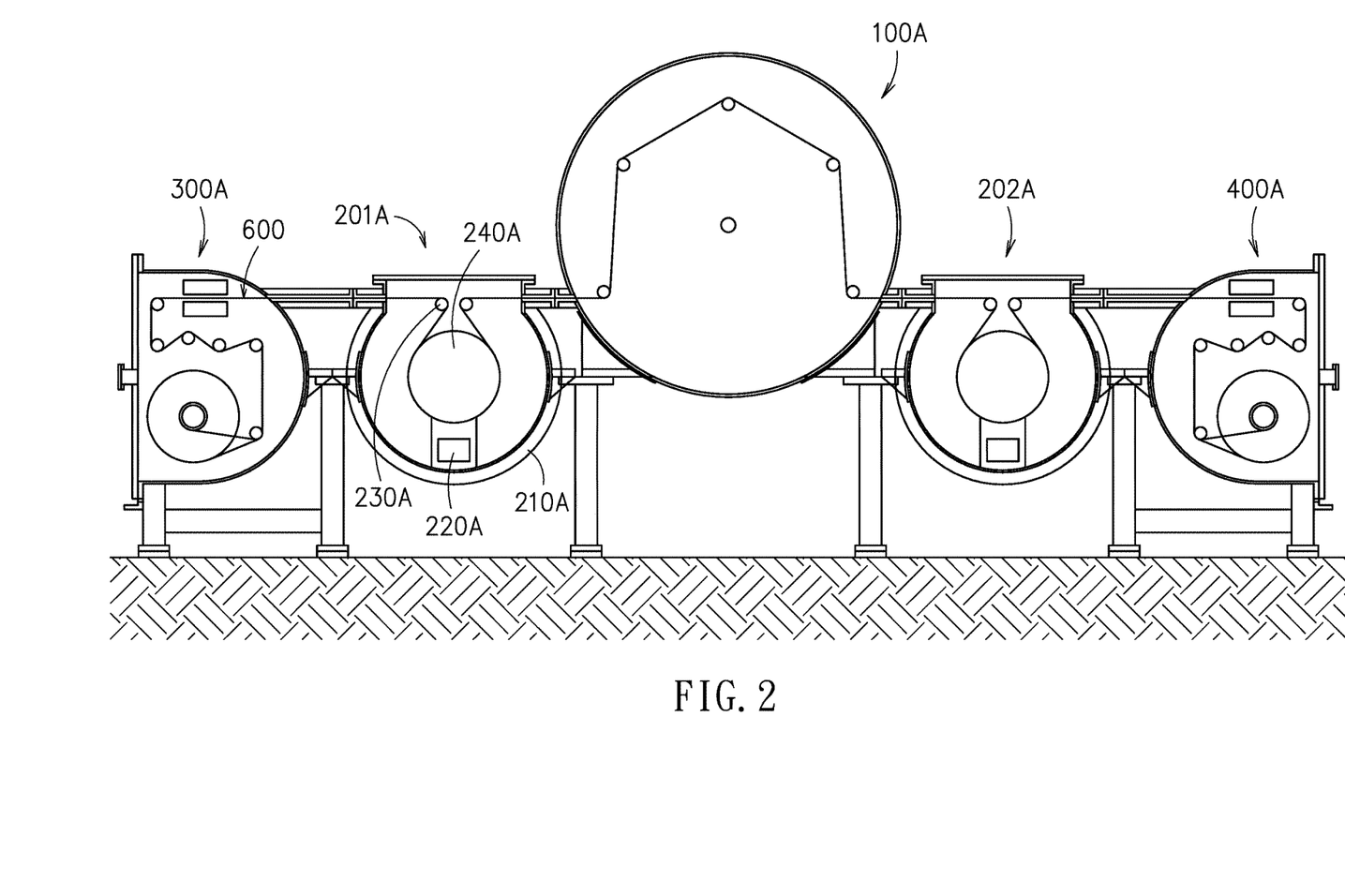
FIG. 2 is a schematic view of one arc plasma processing unit, two magnetron sputtering plasma processing units and two substrate feeding units that are connected in series according to an embodiment of the present invention.

Please refer to FIG. 2, which is a schematic view of one arc plasma processing unit, two magnetron sputtering plasma processing units and two substrate winding/unwinding units that are connected in series according to an embodiment of the present invention. In this embodiment, the roll-to-roll hybrid plasma modular coating system is composed of: a first substrate winding/unwinding unit 300A, a first magnetron sputtering plasma processing unit 201A, an arc plasma processing unit 100A, a second magnetron sputtering plasma processing unit 202A, and a second substrate winding/unwinding unit 400A, that are connected to one another in series. Comparing to the embodiment shown in FIG. 1, there is an additional magnetron sputtering plasma processing unit in the embodiment of FIG. 2, while the structure of the magnetron sputtering plasma processing unit used in this embodiment is also a slightly different from the one shown in FIG. 1. Since the first magnetron sputtering plasma processing unit 201A and the second magnetron sputtering plasma processing unit 202A are the same in structure, only the first magnetron sputtering plasma processing unit 201A is described in the following description for illustration. The first magnetron sputtering plasma processing unit 201A comprises: a second chamber 210A, a magnetron sputtering plasma source 220A, a second roller set 230A, and a cooling roller 230A, in which the second roller set 230A is provided for facilitating the feeding of the substrate 600 and the cooling roller 240A is provided for controlling the temperature of the substrate 600.

Figure 3:
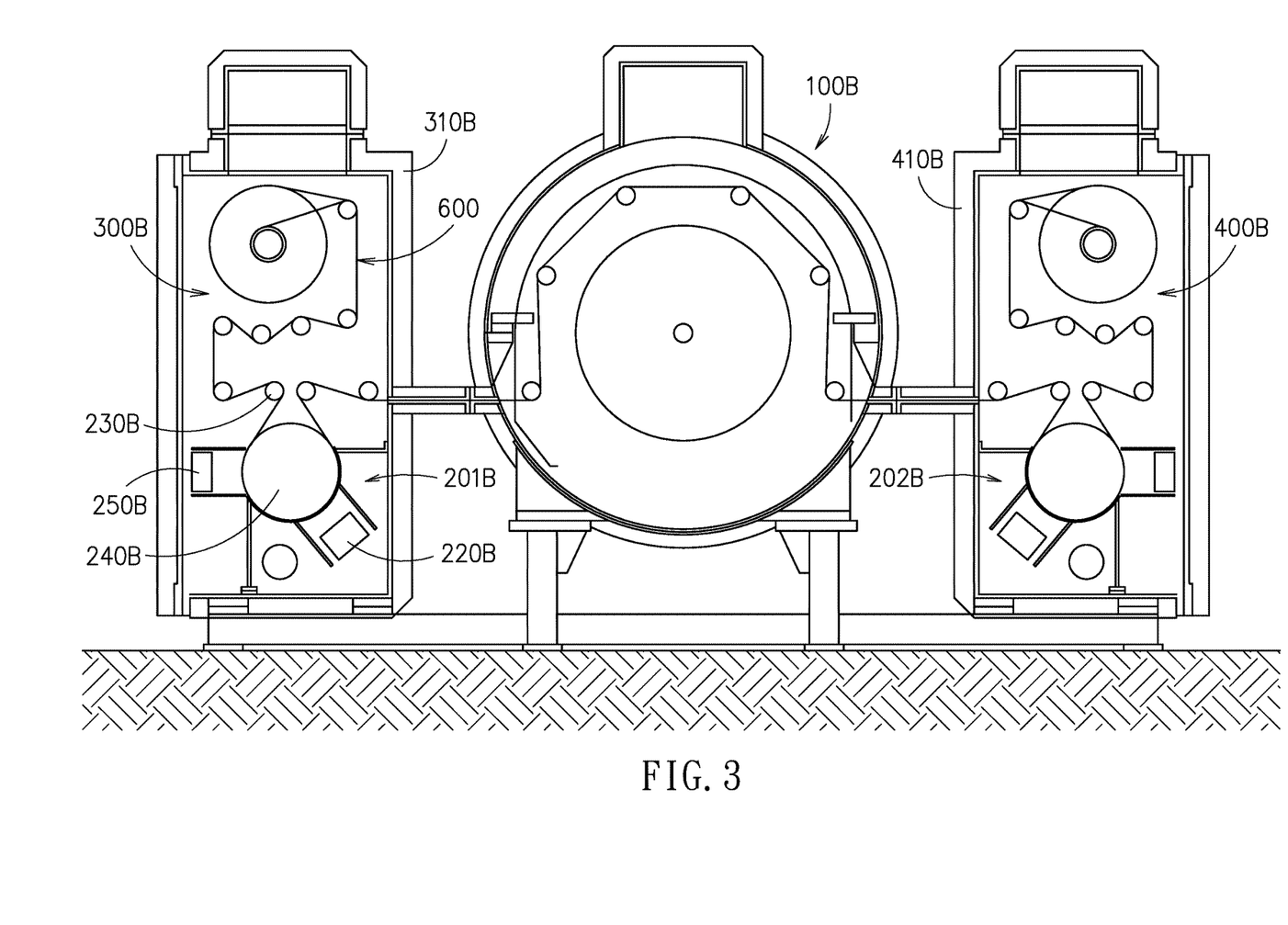
FIG. 3 is a schematic view showing the housing of the magnetron sputtering plasma processing unit and the winding/unwinding unit in the same chamber according to an embodiment of the present invention.

Please refer to FIG. 3, which is a schematic view showing the housing of the magnetron sputtering plasma processing unit and the substrate winding/unwinding unit in the same chamber according to an embodiment of the present invention. In this embodiment, the roll-to-roll hybrid plasma modular coating system is composed of: a first substrate feeding unit 300B, a first magnetron sputtering plasma processing unit 201B, an arc plasma processing unit 100B, a second magnetron sputtering plasma processing unit 202B, and a second substrate winding/unwinding unit 400B, that are connected to one another in series. The architecture of the present embodiment shown in FIG. 3 is similar to the one shown in FIG. 2, but is different in that: the first substrate feeding unit 300B and the first magnetron sputtering plasma processing unit 201B are disposed inside the same chamber, that is, the shared chamber 310B, while the second substrate winding/unwinding unit 400B and the second magnetron sputtering plasma processing unit 202B are disposed inside the same chamber, that is, the shared chamber 410B. Similarly, since the first magnetron sputtering plasma processing unit 201B is arranged symmetrical to the second magnetron sputtering plasma processing unit 202B in structure, only the first magnetron sputtering plasma processing unit 201B is described in the following description for illustration. The first magnetron sputtering plasma processing unit 201B comprises: a magnetron sputtering plasma source 220B, a second roller set 230B, a cooling roller 230B, and a pre-treatment plasma source 250B, in which the pre-treatment plasma source 250B is provided for enabling a pre-treatment process upon the substrate 600.

In the embodiments shown in FIG. 2 and FIG. 3, in one processing cycle, the substrate will be enabled to travel passing through the first magnetron sputtering plasma processing unit, the arc plasma processing unit and the second magnetron sputtering plasma processing unit, and thus to be coated with a three-layer film of magnetron sputtering plasma layer/arc plasma deposition layer/magnetron sputtering plasma layer. On the other hand, if the first magnetron sputtering plasma processing unit, the arc plasma processing unit and the second magnetron sputtering plasma processing unit are not being activated at the same process, another three-layer film of arc plasma deposition layer/magnetron sputtering plasma layer/arc plasma deposition layer can be formed. Taking a multilayer solar control film for example, its basic configuration is dielectric film (oxidation film)/metallic film (Ag)/dielectric film (oxidation film).

Figure 4:
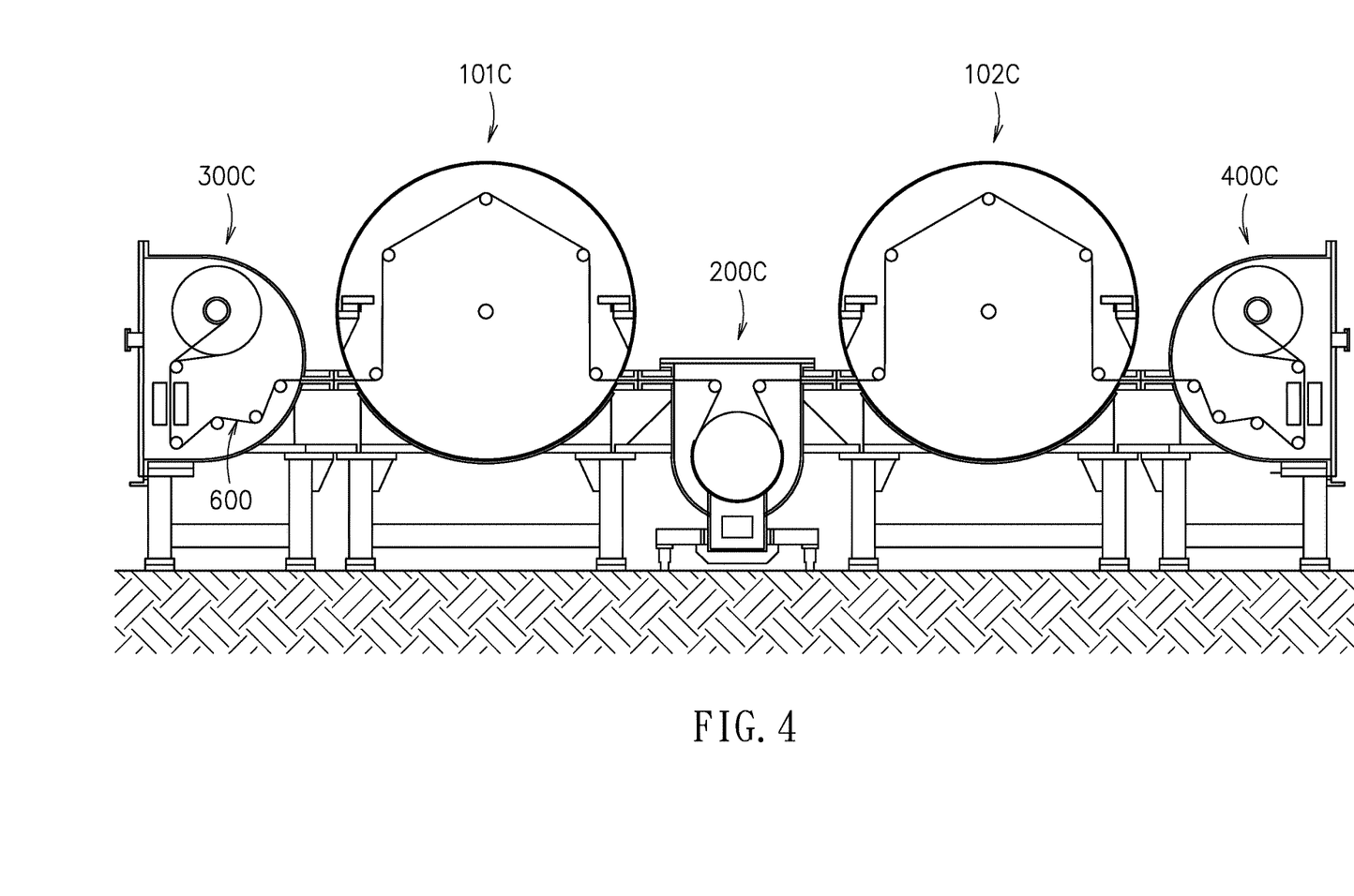
FIG. 4 is a schematic view of two arc plasma processing units, one magnetron sputtering plasma processing unit and two winding/unwinding units that are connected in series according to an embodiment of the present invention.

Please refer to FIG. 4, which is a schematic view of two arc plasma processing units, one magnetron sputtering plasma processing unit and two substrate feeding units that are connected in series according to an embodiment of the present invention. In this embodiment, the roll-to-roll hybrid plasma modular coating system is composed of: a first substrate winding/unwinding unit 300C, a first arc plasma processing unit 101C, a magnetron sputtering plasma processing unit 200C, a second arc plasma processing unit 102C, and a second substrate feeding unit 400C, that are connected to one another in series. Comparing to the embodiment shown in FIG. 1, there is an additional arc plasma processing unit in the embodiment of FIG. 4. Thereby, in one processing cycle, the substrate will be enabled to travel passing through first arc plasma processing unit 101C, the magnetron sputtering plasma processing unit 200C, and the second arc plasma processing unit 102C, and thus to be coated with a three-layer film of arc plasma deposition layer/magnetron sputtering plasma layer/arc plasma deposition layer. Therefore, if a five-layer solar control film of dielectric film (oxidation film)/metallic film (Ag)/dielectric film (oxidation film)/metallic film (Ag)/dielectric film (oxidation film) is required, it is required only to drive the substrate 600 to be feed forward and backward once into the roll-to-roll hybrid plasma modular coating system of FIG. 4.

Although the embodiments shown in FIG. 1 to FIG. 4 are not the same, they all featured by the alternatively arranged and serially connected arc plasma processing units and magnetron sputtering plasma processing units. In addition, despite the shape and formation of the arc plasma processing units shown in FIG. 1 to FIG. 4 are not the same, they all featured by the following characteristic: there are a plurality of first primary rollers being arranged surrounding the arc plasma source, and the arc plasma are emitted radially out of the arc plasma source to be coated onto the substrate. It is noted that the metallic film 500 and the roller set of two rollers 510, 520 that are shown in FIG. 1 can also be used in the arc plasma processing units in FIG. 2 to FIG. 4.

Comparing with the conventional roll-to-roll hybrid plasma modular coating system, the roll-to-roll hybrid plasma modular coating system of the present invention has the following characteristics:

1. The roll-to-roll hybrid plasma modular coating system of the present invention employs the advantages of both the arc plasma processing unit and magnetron sputtering plasma processing unit that it can perform a multilayer film deposition process for coating layers of different characteristics respectively on one process cycle. For instance, it can be used in the production of a multilayer solar control film of dielectric film (oxidation film)/metallic film (Ag)/dielectric film (oxidation film). The arc plasma source is suitable for metals of high melting point, and the magnetron sputtering plasma source is suitable for coating metallic nano-film. Thereby, not only the manufacturing process is simplified and the loading of the plasma source is relieved comparing to a conventional plasma process, but also the production yield of the solar control film as well as the type of solar control films that can be produced are increased.

2. The design of the chambers in the present invention can be modularized in response to the requirement of an actual roll-to-roll multilayer film deposition process.

3. The arc plasma source that be used in the present invention is simple in structure with high target utilization, comparatively the equipment cost and the material cost can be reduced significantly.

4. The present invention relates to a large-area roll-to-roll hybrid plasma modular coating system, which has modularized chamber designed and simple architecture. Thereby, its configuration can be changed easily for various applications.

5. By the use of the arc plasma source without having any magnet disposed therein, the film deposition speed and the film component will not be varied with magnetic field strengths at the target surface even after a long period of operation.

6. The arc plasma source in the present invention is disposed away from the substrate at a distance farther than that in a conventional system, i.e. the distance in a conventional system is about 10 cm, but in the present invention, it is about 30-200 cm. Consequently, since the plasma in the present invention is emitted radially out of the arc plasma source, the effective width can achieve several meters. In addition, the temperature of the polymer material used in the present will not be raised significantly, so that the system of the present invention can function smoothly without any cooling device, and the cost is reduced.

7. As the arc plasma source in the present invention is disposed farther away from the substrate, there will low flux in the system of the present invention, resulting that the amount reactive gas used for eliminating target poisoning can be reduced.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

What is claimed is:

1. A roll-to-roll hybrid plasma modular coating system, comprising:
   at least one arc plasma processing unit, each formed with a first chamber and an arc plasma source for producing arc plasma that is housed inside the first chamber, wherein the each of the at least one arc plasma processing unit comprises a first set of rollers that are disposed around the periphery of the arc plasma source;
   at least one magnetron sputtering plasma processing unit, each formed with a second chamber and a magnetron sputtering plasma source for producing magnetron sputtering plasma that is housed inside the second chamber;
   a metallic film, disposed in the arc plasma processing unit to avoid deposition of target material on a wall in the first chamber and disposed at positions of the wall that are not covered by a substrate;
   a first substrate feeding unit comprising a second set of rollers for one of winding and unwinding the substrate, formed with a third chamber; and
   a second substrate feeding unit comprising a third set of rollers for the other of winding and unwinding the substrate, formed with a fourth chamber;
   whereas the at least one arc plasma processing unit, the at least one magnetron sputtering plasma processing unit and the at least one of the first and the second substrate feeding units are connected in series to be used for depositing at least one thin layer by arc plasma deposition or at least one thin layer by magnetron sputtering plasma on the substrate during the feeding of the substrate.

2. The roll-to-roll hybrid plasma modular coating system of claim 1, comprising a plurality of arc plasma processing units and a plurality of magnetron sputtering plasma processing units, while allowing the plurality of arc plasma processing units and the plurality of magnetron sputtering plasma processing units to be alternatively disposed and serially connected with respect to each other.

3. The roll-to-roll hybrid plasma modular coating system of claim 1, wherein the at least one magnetron sputtering plasma processing unit is received in a first same chamber with one of the first and the second substrate feeding units.

4. The roll-to-roll hybrid plasma modular coating system of claim 1, wherein the second chamber has a fourth set of rollers and a cooling roller disposed therein, and the fourth set of rollers is used to transport the substrate and the cooling roller is provided for controlling the temperature of the substrate.

5. The roll-to-roll hybrid plasma modular coating system of claim 1, wherein the metallic film is made of a material selected from the group consisting of: aluminum and stainless steel.

6. The roll-to-roll hybrid plasma modular coating system of claim 1, wherein gas isolation chambers are disposed at positions between the first chamber, the second chamber and the third chamber, and each of the gas isolation chambers is provided for restricting diffusion of process gas between any two adjacent chambers of the first chamber, the second chamber and the third chamber.

7. The roll-to-roll hybrid plasma modular coating system of claim 1, wherein the metallic film is rollable, and a portion of the rollable film which has been deposited by arc plasma thereon in a manufacturing process can be rolled up for exposing a portion of the rollable film not yet being deposited by the arc plasma thereon.

8. The roll-to-roll hybrid plasma modular coating system of claim 1,
   wherein the first set of rollers comprises a plurality of first primary rollers and a plurality of first secondary rollers in a manner that the plurality of first primary rollers are arranged surrounding the arc plasma source;
   wherein the first chamber is formed with a first opening and a second opening at positions for allowing at least one of the plurality of first secondary rollers to be arranged neighboring to the first opening and at least one of the plurality of first secondary rollers other than the at least one first secondary roller neighboring to the first opening to be arranged neighboring the second opening; and
   wherein the substrate is formed with a first surface and a second surface that are arranged opposite to each other in a manner that the first surface is disposed facing toward the plurality of first primary rollers and abutting against the periphery of the plurality of first primary rollers; the substrate is formed with two opposite ends; and portions of the second surface corresponding to the two ends of the substrate are arranged abutting respectively against first secondary rollers that are disposed neighboring to the first opening and the second opening so as to enable the two ends of the substrate to extend out of the first chamber respectively via the first opening and the second opening.

9. The roll-to-roll hybrid plasma modular coating system of claim 1, wherein the first substrate feeding unit, one of the at least one arc plasma processing unit, one of the at least one magnetron sputtering plasma processing unit and the second substrate feeding unit are connected in series to be used for depositing a first layer by the arc plasma and a second layer by the magnetron sputtering plasma on the substrate.

10. The roll-to-roll hybrid plasma modular coating system of claim 1, wherein the first substrate feeding unit, a first one of the at least one magnetron sputtering plasma processing unit, one of the at least one arc plasma processing unit, a second one of the at least one magnetron sputtering plasma processing unit and the second substrate feeding unit are connected in series to be used for depositing a first layer by the magnetron sputtering plasma, a second layer by the arc plasma and a third layer by the magnetron sputtering plasma on the substrate.

11. The roll-to-roll hybrid plasma modular coating system of claim 1, wherein the first substrate feeding unit, a first one of the at least one arc plasma processing unit, one of the at least one magnetron sputtering plasma processing unit, a second one of the at least one arc plasma processing unit and the second substrate feeding unit are connected in series to be used for depositing a first layer by the arc plasma, a second layer by the magnetron sputtering plasma and a third layer by the arc plasma on the substrate.

12. The roll-to-roll hybrid plasma modular coating system of claim 10, wherein the first substrate feeding unit and the first one of the at least one magnetron sputtering plasma processing unit are in a second same chamber, and the second one of the at least one magnetron sputtering plasma processing unit and the second substrate feeding unit are in a third same chamber.

* * * * *